(12) United States Patent
Liu

(10) Patent No.: US 7,335,034 B1
(45) Date of Patent: Feb. 26, 2008

(54) STRUCTURE FOR MEMORY CARDS

(76) Inventor: Chin-Tong Liu, No. 20, Lane 496, Nioupu S. Rd., Hsinchu City (TW)

( * ) Notice: Subject to any disclaimer, the term of this patent is extended or adjusted under 35 U.S.C. 154(b) by 0 days.

(21) Appl. No.: 11/621,566

(22) Filed: Jan. 10, 2007

(30) Foreign Application Priority Data

Nov. 28, 2006 (TW) .............................. 95144039 A

(51) Int. Cl.
*H01R 12/00* (2006.01)
(52) U.S. Cl. ..................................... 439/76.1
(58) Field of Classification Search .............. 439/76.1, 439/946; 361/737, 736; 253/492, 845, 846
See application file for complete search history.

(56) References Cited

U.S. PATENT DOCUMENTS

| | | | |
|---|---|---|---|
| 6,381,143 B1* | 4/2002 | Nakamura | 361/737 |
| 6,646,885 B1* | 11/2003 | Yu et al. | 361/737 |
| 7,032,827 B2* | 4/2006 | Wang et al. | 235/492 |
| 7,059,871 B1* | 6/2006 | Hsiao | 439/76.1 |
| 2007/0023530 A1* | 2/2007 | Aoki et al. | 235/492 |
| 2007/0108295 A1* | 5/2007 | Liu et al. | 235/492 |
| 2007/0145153 A1* | 6/2007 | Liu | 235/492 |

FOREIGN PATENT DOCUMENTS

JP          1275098          3/2007

* cited by examiner

*Primary Examiner*—Phuong Dinh

(57) ABSTRACT

A structure for memory card is provided, including a bottom shell, a circuit substrate, a top shell, and a covering layer. The bottom shell includes a base seat of a smaller area size. The circuit substrate includes a first surface and an opposite second surface. The first surface includes chips and circuits, and the second surface includes an electrical contact part. The chips and the circuits are connected to the electrical contact part. The circuit substrate also includes a plurality of connecting holes. The connecting holes are preferably located around the electrical contact part. The circuit substrate is attached to the base seat of the bottom shell on the first surface, and the top shell covers the second surface of the circuit substrate, with the electrical contact part exposed. The covering layer is formed directly on the circumference and the seam of the top shell, bottom shell, and circuit substrate, and fills the connecting holes to engage the top shell and the bottom shell. The covering layer forms the memory card of a standard physical specification.

14 Claims, 7 Drawing Sheets

STRUCTURE FOR MEMORY CARDS

FIELD OF THE INVENTION

The present invention generally relates to a memory card, and more specifically to a structure for memory cards with higher durability and improved waterproof.

BACKGROUND OF THE INVENTION

The flash memory cards, such as compact flash (CF) cards, smart media cards (SMC), multimedia cards (MMC), secure digital (SD) cards, and memory sticks (MS), are used in a wide range of electronic products, including mobile phones, MP3 players, digital cameras, and so on. The durability and the waterproof are important issues for the design of the structure for memory cards. Taiwan Patent Application No. 94146117 disclosed a structure and method for packaging a memory card. A circuit substrate is placed on a bottom shell, and partially covered with a top shell. An insert molding with the same material as the bottom shell and a top shell is used to seal the bottom and top shells to form a monolithic memory card. The disclosed structure provides enhanced strength and improved waterproof. The inventor of the above disclosed invention continuously seeks to provide an even more improved structure for memory cards.

SUMMARY OF THE INVENTION

The primary object of the present invention is to provide a structure for memory cards with enhanced sealing and fixation capability so as to improve the durability and waterproof, including the use of a plurality of connection holes on the circuit substrate so that the connection holes will be filled with the same material as the insert molding to hold all the elements, such as top shell and bottom shell, tightly sealed.

Another object of the present invention is to provide a structure for memory cards with enhanced durability around the electrical contact part. As the electrical contact part of the memory card used for connecting to the electronic device includes a plurality of independent and separate areas made of thin metal layer, the small spacing distance between the neighboring metal areas usually makes the structure around the electrical contact part fragile. The structure of the present invention includes a plurality of connecting holes on the circuit substrate around the electrical contact part. The connecting holes will be filled with the same material as the insert molding so that the final sealed structure of the memory card has stronger durability around the electrical contact part.

Yet another object of the present invention is to provide a structure for memory cards with better thermal dissipation. By replacing part of the area on the top shell and bottom shell with a metal material, the heat generated by the memory chip operation can be effectively dissipated through the metal areas on the top and bottom shells of the memory card.

To achieve the above objects, the present invention provides a structure for memory cards, including a bottom shell, a circuit substrate, a top shell, and a covering layer. The bottom shell includes a base seat of a smaller area size. The circuit substrate includes a first surface and an opposite second surface. The first surface includes chips and circuits, and the second surface includes an electrical contact part. The chips and the circuits are connected to the electrical contact part. The circuit substrate also includes a plurality of connecting holes. The connecting holes are preferably located around the electrical contact part. The circuit substrate is attached to the base seat of the bottom shell on the first surface, and the top shell covers the second surface of the circuit substrate, with the electrical contact part exposed. The covering layer is formed directly on the circumference and the seam of the top shell, bottom shell, and circuit substrate, and fills the connecting holes to engage the top shell and the bottom shell. The covering layer forms the memory card of a standard physical specification.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
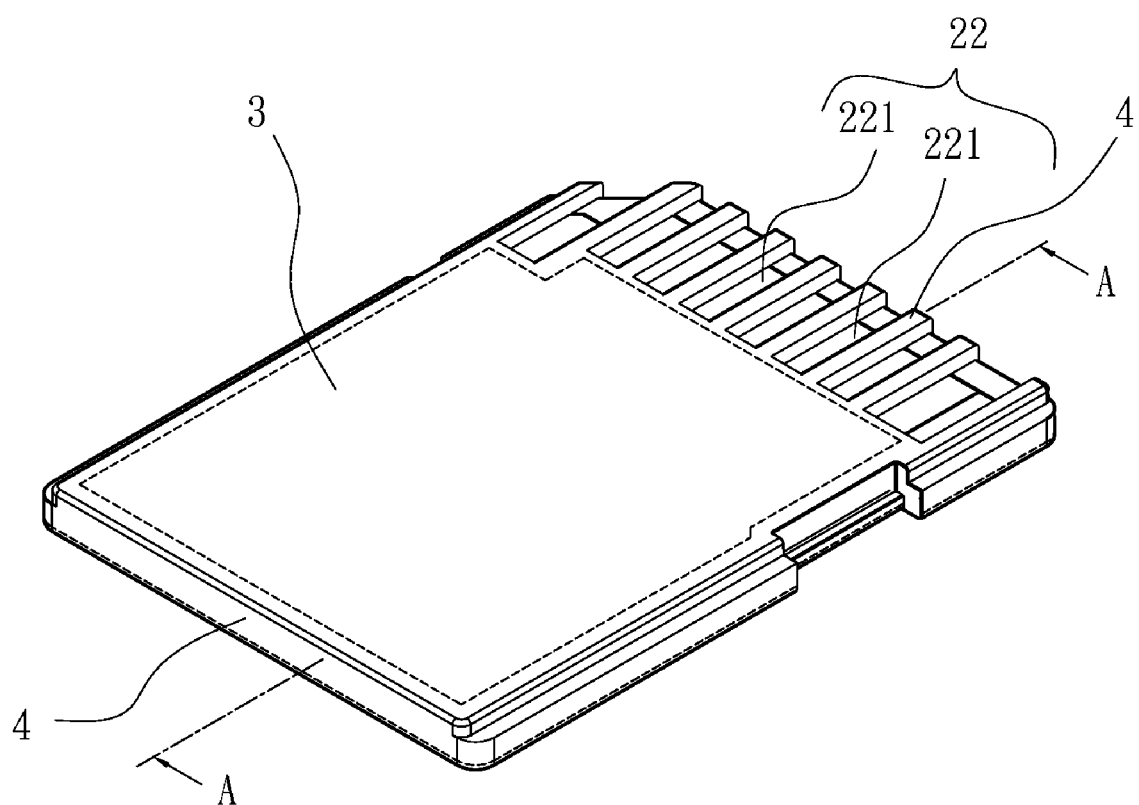
FIG. 1 shows a three-dimensional view of the present invention.
Figure 2:
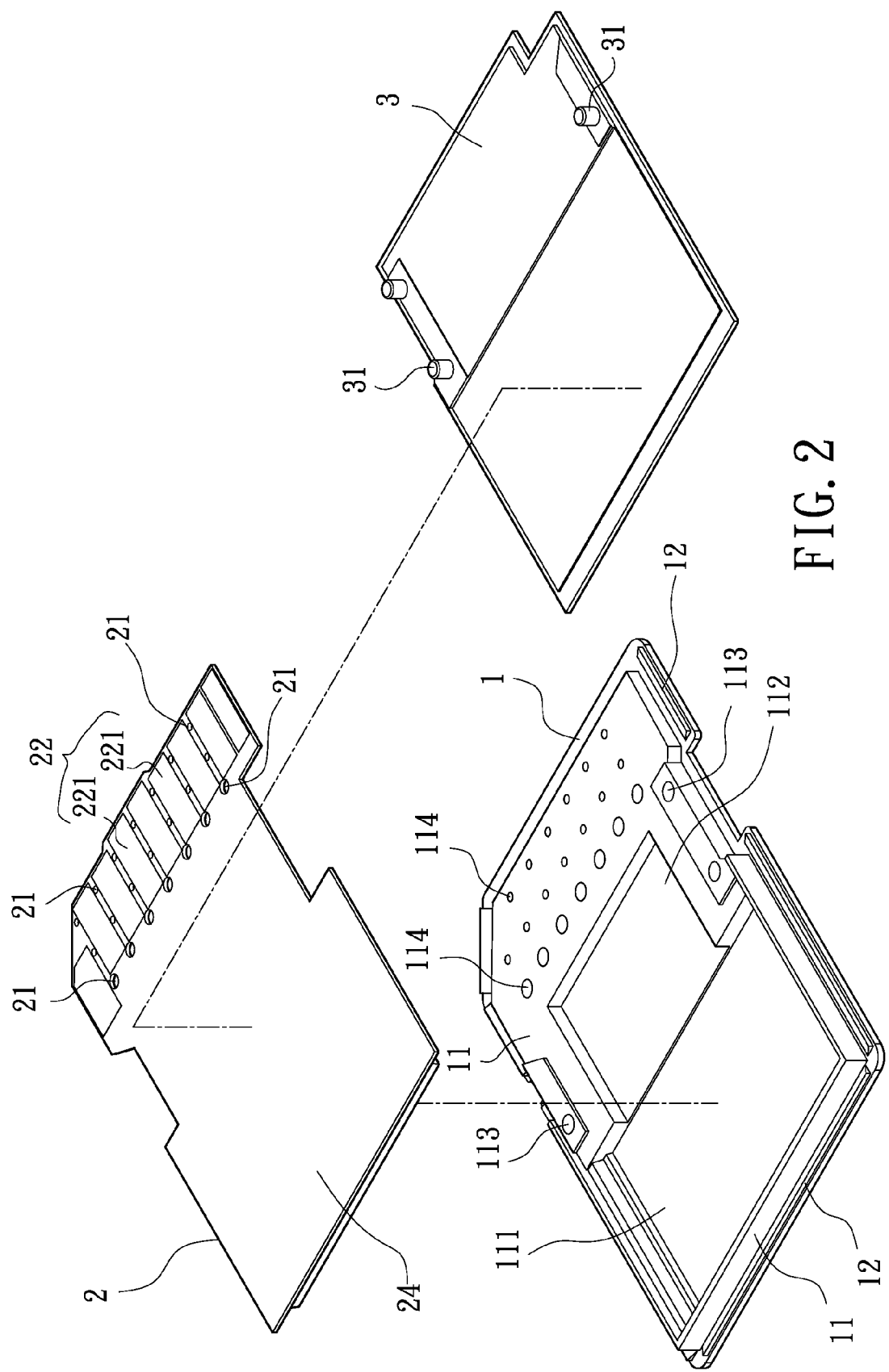
FIG. 2 shows an exploded view of the structure of the present invention.

FIG. 1 and FIG. 2 show a three-dimensional view and the exploded view of the present invention respectively. The structure of the memory card of the present invention includes a bottom shell 1, a circuit substrate 2, a top shell 3, and a sealing layer 4. Bottom shell 1 includes a protruding base seat 11 of an area size slightly smaller than the standard specification. Circuit substrate 2 is placed on top of base seat 11 during the packaging. The surface of base seat 11 is designed to match the components on the surface of circuit substrate 2, instead of a flat surface. Circuit substrate 2 includes a plurality of connecting holes 21. Connecting holes 21 are preferably located around electrical contact part 22. Top shell 3 covers a part of the surface of circuit substrate 2, with electrical contact part 22 exposed. Covering layer 4 is formed directly on the circumference and seams of bottom shell 1, circuit substrate 2, and top shell 3, the area of electrical contact part 22, and fills connecting holes 21, and forms a complete shape of a memory card. Because covering layer 4 is made of the same material as bottom shell 1 and top shell 3, the formation of sealing layer 4 is fused seamlessly with bottom shell 1 and top shell 3. The dash line of FIG. 1 indicates the area formed by covering layer 4. With connecting holes 21 of circuit substrate 2, the material of covering layer 4 can fills connecting holes 21 to enhance the engagement of top shell 3 and bottom shell 1 around electrical contact part 22 during formation. Therefore, the formed memory card has an enhanced fixation and sealing effect around the electrical contact part.

Figure 3:
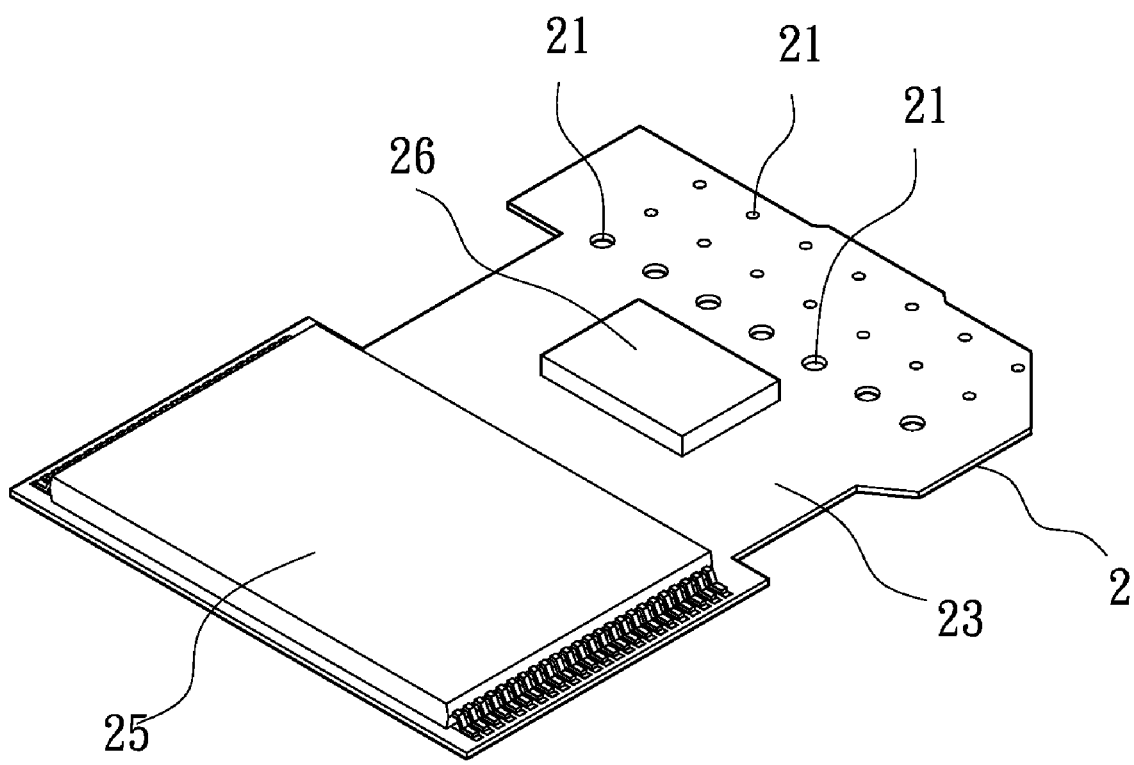
FIG. 3 shows a three-dimensional view of the present invention from a different angle.

The following describes the details of the above components of the structure. As shown in FIGS. 2 & 3, circuit substrate 2 is a circuit board, having a first surface 23 and an opposite second surface 24. First surface 23 includes at least a memory chip 25 and a control chip 26. Second surface 24 includes electrical contact part 22. Electrical contact part 22 includes a plurality of independent and separate metal areas 221 made of metal thin film for providing electrical connection to an electronic device. Circuit substrate 2 also includes circuits to provide electrical connection to chips and electrical contact part 22. In this embodiment, the neighboring area around electrical contact part 22 includes a plurality of connecting holes 21 penetrating circuit substrate 2. The sizes of connecting holes 21 are not necessarily identical. Connecting holes 21 on the inner side of electrical contact part 22, away from the edge of circuit substrate 2, are larger, and connecting holes 21 between neighboring metal areas 221 are smaller.

Bottom shell 1 includes a base seat 11. The circumference of base seat 11 is smaller than a standard size memory card. The shape of base seat 11 is not fixed, but matches the locations of memory chips 25, control chip 26, solder points, and other electronic components on first surface 23 of circuit substrate 2. The present invention shows an embodiment, and the shape of base seat 11 is not limited to the shape of the embodiment. The top surface of base seat 11 includes at least a housing trench 111 and a corresponding trench 112. The shape and the location of housing trench 111 match the shapes of memory chips 25 of circuit substrate 2. The smaller corresponding trench 112 matches the shapes of control chip 26 and solder points of circuit substrate 2. The two areas close to the two side edges on base seat 11 include a plurality of alignment holes 113 for providing alignment to top shell 3. The area below the location for electrical contact part 22 of circuit substrate 2 on base seat 11 includes a plurality of non-penetrating engaging trenches 114. The sizes of engaging trenches 114 are not identical, but the locations must match to correspond to connecting holes 21 around electrical contact part 22. To improve the fixation of the engagement, bottom shell 1 includes slanted surface 12 on at least two sides of the area surrounding base seat 11. Slanted surface 12 increases the strength of the engagement of covering layer 4 with the material.

Figure 4:
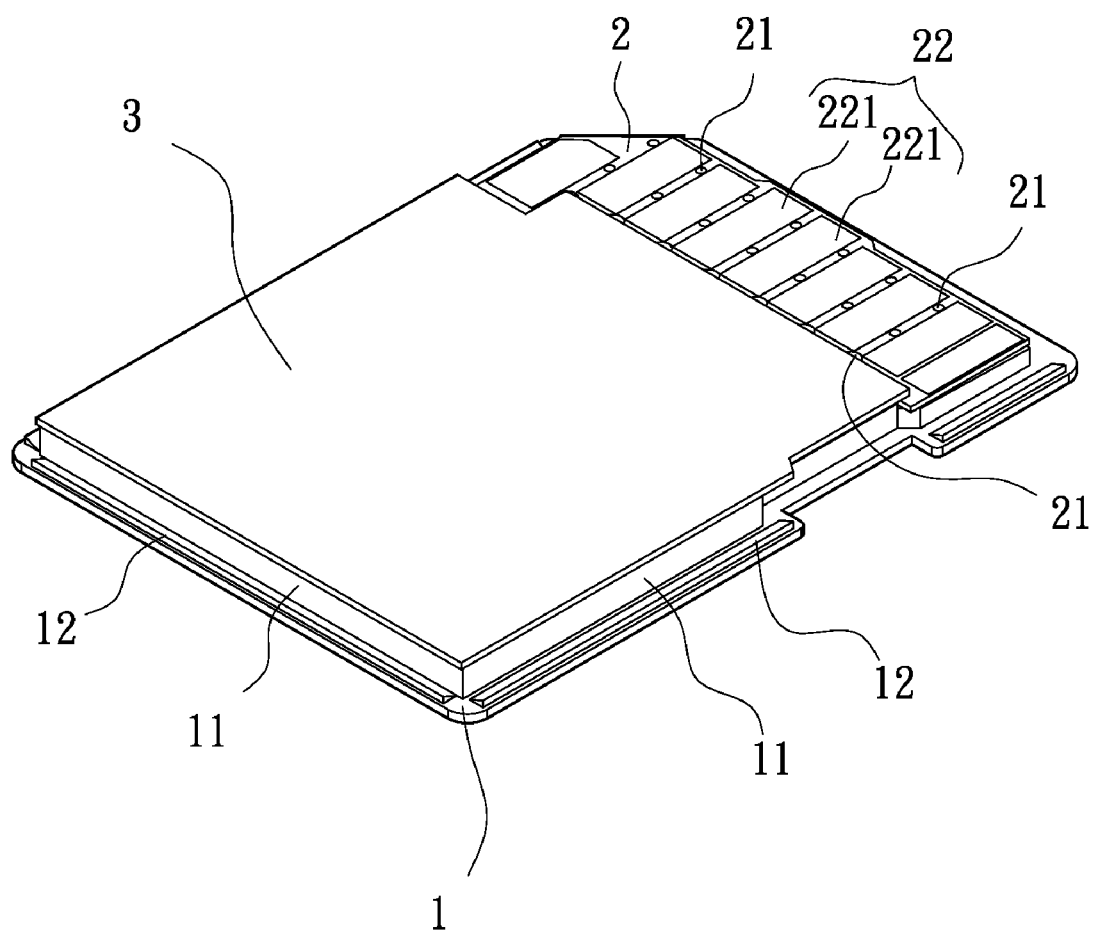
FIG. 4 shows a three-dimensional view after the bottom shell, the circuit substrate and the top shell being assembled.

For the assembly, top shell 3 covers only a part of the area of second surface 24 of circuit substrate 2, with electrical contact part 22 exposed. The shape of top shell 3 matches the shape of base seat 11. The areas close to the edges of both sides of top shell 3 includes a plurality of alignment columns 31. Alignment columns 31 insert into alignment holes 113 of base seat 1 of bottom shell 1 for further fixation. As shown in FIG. 4, to increase the fixation, top shell 3 is slightly wider than the width of base seat 11, and is smaller than the standard memory card. Therefore, covering layer 4 can effectively engage bottom shell 1 and top shell 3. When top shell 3 covers circuit substrate 2, top shell 3 does not fully cover the larger connecting holes 21 close to the electrical contact part 22 so that the material for covering layer 4 can fill connecting holes 21 during the formation.

Figure 5:
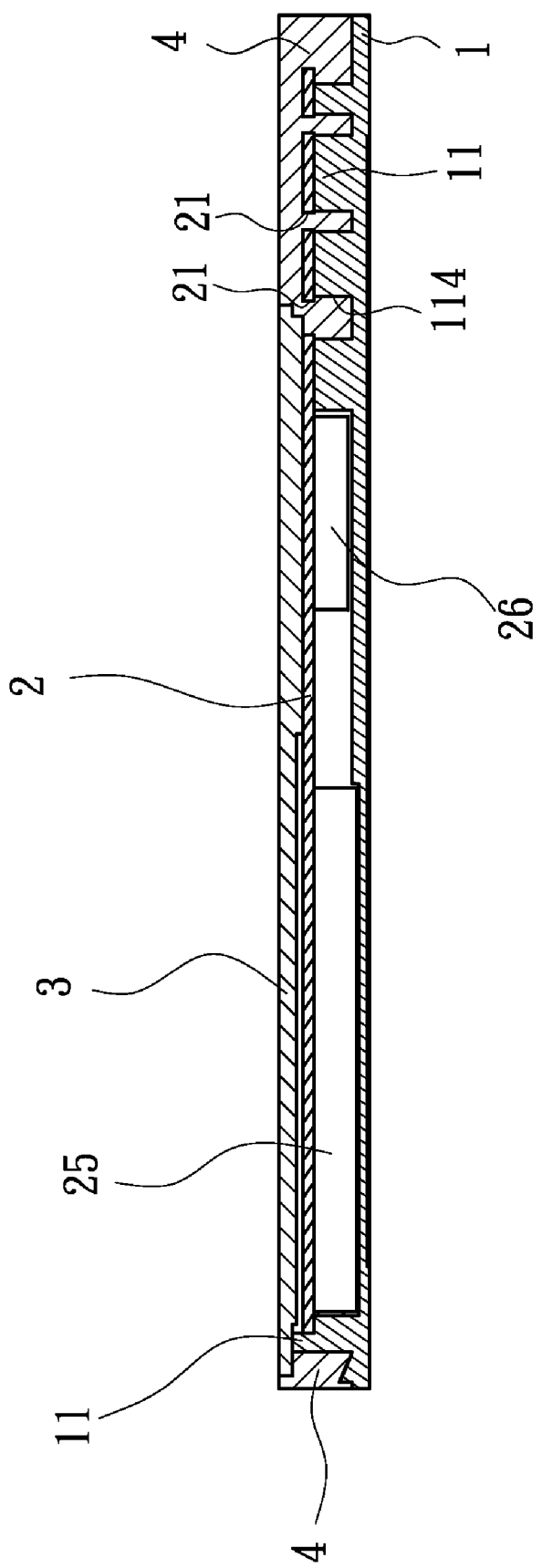
FIG. 5 shows a cross-sectional view of AA of FIG. 1.

As shown in FIGS. 1 & 5, covering layer 4 is formed by injection molding of a material directly on the circumferences and contacting part between bottom shell 1, circuit substrate 2, and top shell 3. Covering layer 4 is also formed on the areas between the neighboring metal areas 221 of electrical contact part 22 of circuit substrate 2. Covering layer 4 forms the shape of a standard memory card. Because circuit substrate 2 includes a plurality of connecting holes 21, the material filling larger connecting holes 21 can engage the top surface of base seat 11 of bottom shell 1 and top shell 3 when the material of covering layer 4 fills connecting holes 21 around electrical contact part 22, while the material filling smaller connecting holes 21 can engage engaging trenches 114 of base seat 11. Therefore, the overall strength is enhanced, and top shell 3 will not be easily disengaged from circuit substrate 2. The sealing is improved and the waterproof effect is also increased.

Figure 6A:
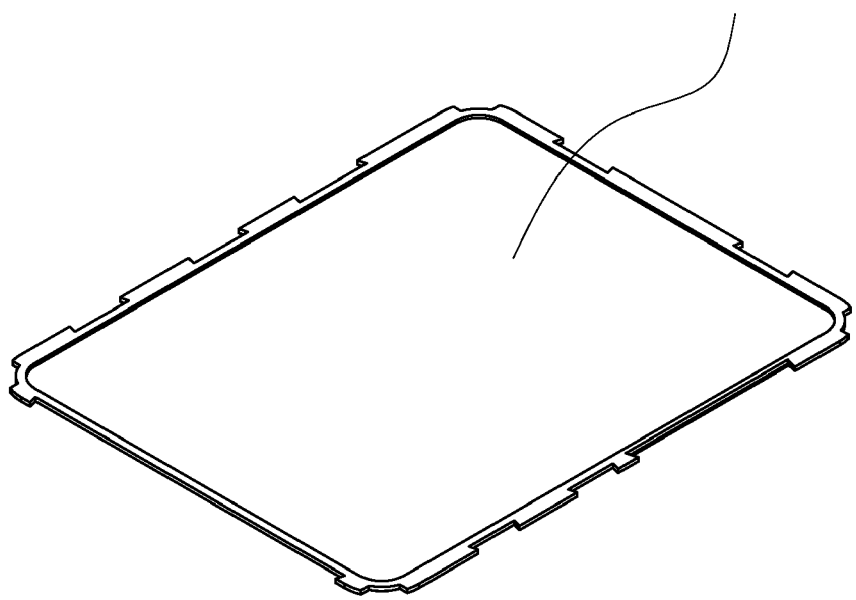
FIG. 6A shows a three-dimensional view of the second embodiment of the present invention with metal sheet.
Figure 6B:
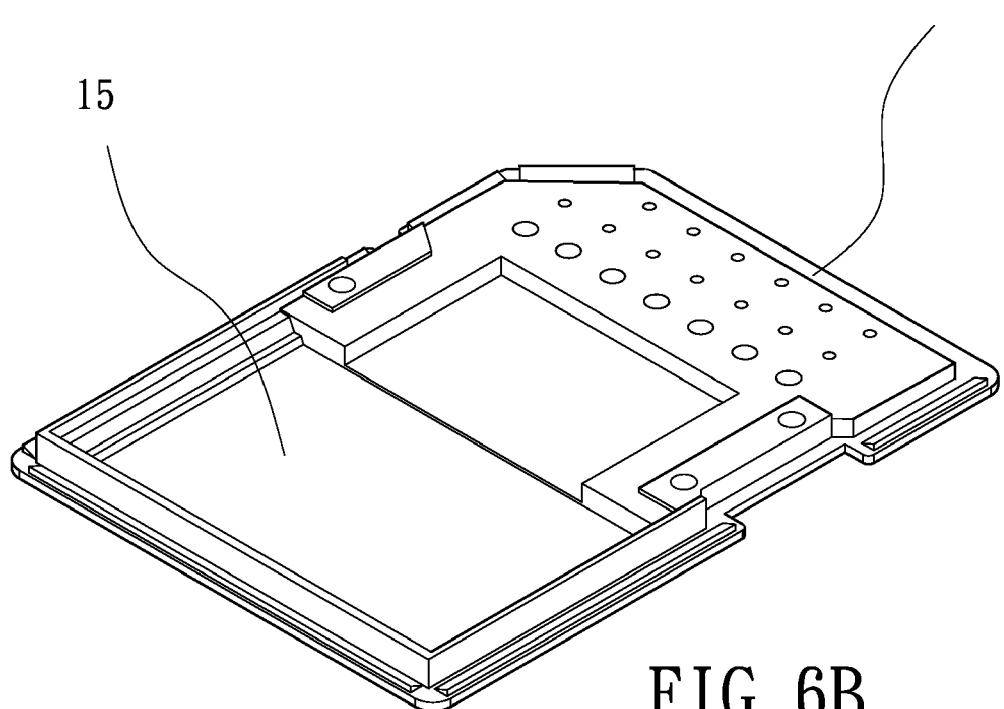
FIG. 6B shows a three-dimensional view of the bottom shell made by injection molding based on metal sheet.
Figure 7:
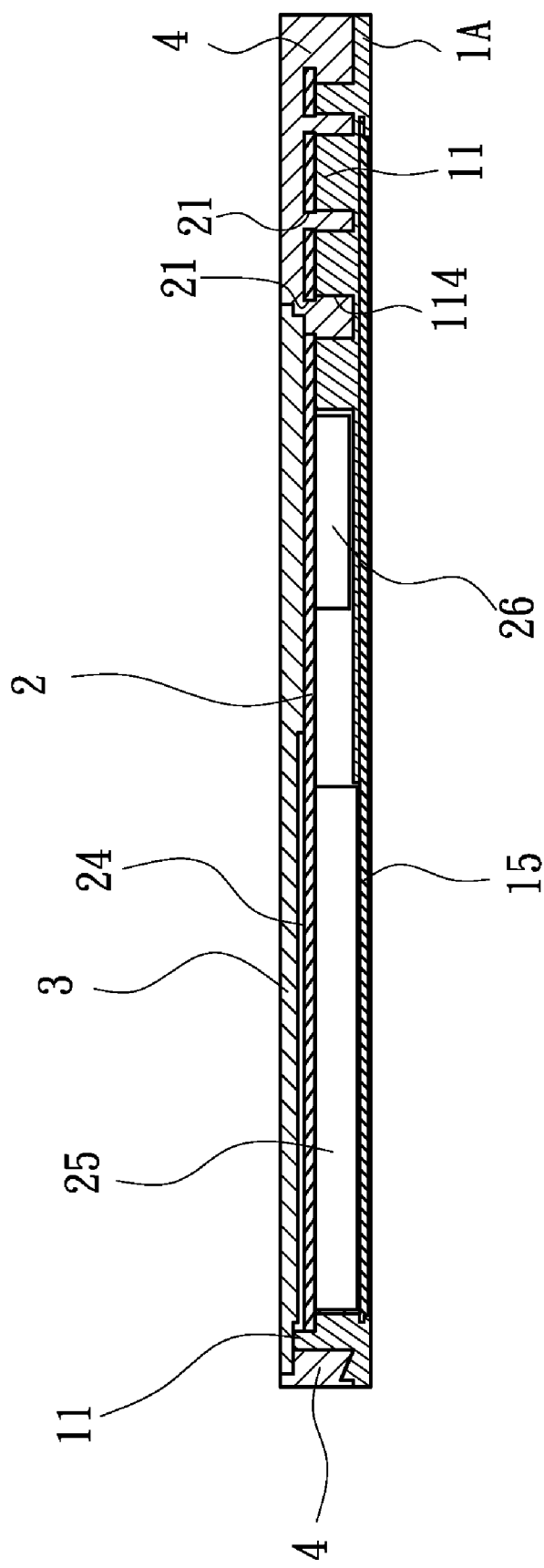
FIG. 7 shows a cross-sectional view of the second embodiment of the present invention.

In the above embodiment, bottom shell 1 and top shell 3 are made of plastic or other material by injection molding. The material is non-conductive for heat and electricity. Therefore, the above embodiment is not thermal dissipative, but is good in waterproof. However, as the capacity of memory card increases, the demand in thermal dissipation is also increased. The following embodiment provides a memory card structure with good thermal dissipation effect. The components of the structure are the same as the embodiment shown in FIG. 1, except the material used. In this embodiment, top shell 3 is made of metal, and a part of bottom shell 1 is also made of metal. As shown in FIG. 6A, bottom shell 1A includes a large area metal sheet 15. FIG. 6B shows the shape of bottom shell 1A, the same as bottom shell 1 of FIG. 1, formed by injection molding of a material surrounding metal sheet 15. FIG. 7 shows a cross-sectional view of the memory card structure with thermal dissipation effect. When top shell 3 covers second surface 24 of circuit substrate 2, covering layer 4 seals the circumferences and contact parts between bottom shell 1, circuit substrate 2, and top shell 3, and fills connecting holes 21 on circuit substrate 2. Because top shell 3 of this embodiment is metal, the longitudinal length is shorter and will not form electrical contact with the electrical contact part when covering second surface 24 of circuit substrate 2. Therefore, no short-circuit will occur. Also, second surface 24 of circuit substrate 2 is covered with non-conductive material except electrical contact part 22. Metal sheet 15 of bottom shell 1A contacts the non-conductive surface of memory chips 25 of circuit substrate 2 for dissipating heat generated by memory chips 25. As top shell 3 is also made of metal, the heat generated inside the memory card structure can be effectively dissipated through top shell 3 to reduce the temperature. Thus, this embodiment provides a memory card structure with thermal dissipation effect.

In summary, the present invention uses a plurality of connecting holes on the circuit substrate to enhance the engagement strength by filling the connecting holes with the material of the covering layer when the bottom shell, the circuit substrate and the top shell are assembled. The covering layer also covers the circumferences and the contact between the bottom shell, the circuit substrate and the top shell. This structure provides better sealing and waterproof. In addition, by using the top shell and part of the bottom shell made of metal, the memory card structure can provide better heat dissipation. The memory card structure of the present invention is both novel and practical.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A structure for a memory card, comprising:
   a bottom shell having a large area base seat with an area smaller than the standard specification of the memory card;
   a circuit substrate having a first surface and a second surface, said first surface having a plurality of chips, said second surface having an electrical contact part, said circuit substrate having a circuit for electrical connection to said chips and said electrical contact part, and said first surface being placed on said base seat of said bottom shell;
   a top shell placed on said second surface of said circuit substrate with said electrical contact part exposed; and
   a covering layer formed by a material on circumference and contact areas between said bottom shell, said circuit substrate and said top shell;
   wherein said circuit substrate has a plurality of connecting holes, and said material for said covering layer also fills said connecting holes to engage at least one of said bottom shell and said top shell.

2. The structure as claimed in claim 1, wherein said connecting holes of said circuit substrate are in the area around said electrical contact part.

3. The structure as claimed in claim 1, wherein said connecting holes of said circuit substrate are located at an inner side away from edges of said circuit substrate.

4. The structure as claimed in claim 1, wherein said electrical contact part of said circuit substrate comprises a plurality of neighboring separate metal areas, said metal areas are made of metal thin film, and said connecting holes are located between said neighboring metal areas.

5. The structure as claimed in claim 1, wherein said base seat of said bottom shell comprises a plurality of non-penetrating engaging trenches located to match said connecting holes on said circuit substrate, and said material for said covering layer also fills said engaging trenches.

6. The structure as claimed in claim 1, wherein said top shell covers said second surface of said circuit substrate, but not fully covers said connecting holes on an inner side of said electrical contact part.

7. The structure as claimed in claim 1, wherein said base seat of said bottom shell comprises a plurality of alignment holes, and said top shell comprises a plurality of protruding columns at corresponding locations, and said protruding columns insert into said alignment holes.

8. The structure as claimed in claim 1, wherein the surface shape of said base seat of said bottom shell matches the shape of said chips on said first surface of said circuit substrate.

9. The structure as claimed in claim 1, wherein said chips of said circuit substrate comprise at least a memory chip, said base seat of said bottom shell comprises at least a housing trench with shape and size matching said memory chip, and when assembled, said memory chip is housed inside said housing trench.

10. The structure as claimed in claim 1, wherein said chips of said circuit substrate comprise at least a control chip, said base seat of said bottom shell comprises at least a corresponding trench with shape and size matching said control chip and solder points of said circuit substrate, and when assembled, said control chip and said solder points are housed inside said corresponding trench.

11. The structure as claimed in claim 1, wherein said bottom shell and said top shell are made of non-metal material.

12. The structure as claimed in claim 1, wherein said bottom shell and said top shell are made of a same material.

13. The structure as claimed in claim 1, wherein said top shell is made of metal.

14. The structure as claimed in claim 1, wherein said bottom shell comprises a metal sheet.

* * * * *